United States Patent
Ahn et al.

(10) Patent No.: US 10,957,414 B1
(45) Date of Patent: Mar. 23, 2021

(54) METHOD OF TEST AND REPAIR OF MEMORY CELLS DURING POWER-UP SEQUENCE OF MEMORY DEVICE

(71) Applicant: SAMSUNG ELECTRONICS CO., LTD., Suwon-si (KR)

(72) Inventors: Youngman Ahn, Hwaseong-si (KR); Sangyeol Lee, Suwon-si (KR); Jonggeon Lee, Seoul (KR)

(73) Assignee: Samsung Electronics Co., Ltd.

( * ) Notice: Subject to any disclaimer, the term of this patent is extended or adjusted under 35 U.S.C. 154(b) by 0 days.

(21) Appl. No.: 16/862,964

(22) Filed: Apr. 30, 2020

(30) Foreign Application Priority Data

Sep. 2, 2019 (KR) .................. 10-2019-0108457

(51) Int. Cl.
| | |
|---|---|
| *G11C 29/44* | (2006.01) |
| *G11C 29/46* | (2006.01) |
| *G11C 29/12* | (2006.01) |
| *G11C 29/50* | (2006.01) |

(52) U.S. Cl.
CPC .... *G11C 29/4401* (2013.01); *G11C 29/12005* (2013.01); *G11C 29/12015* (2013.01); *G11C 29/46* (2013.01); *G11C 29/50008* (2013.01); *G11C 2029/4402* (2013.01)

(58) Field of Classification Search
CPC ... G11C 29/50; G11C 29/50008; G11C 29/12; G11C 29/08
See application file for complete search history.

(56) References Cited

U.S. PATENT DOCUMENTS

| | | | |
|---|---|---|---|
| 6,757,857 B2 | 6/2004 | Lamb et al. | |
| 8,286,044 B2 | 10/2012 | Foster, Sr. et al. | |
| 10,216,550 B2 | 2/2019 | Aneja et al. | |
| 2012/0191964 A1 | 7/2012 | Lee et al. | |
| 2013/0173970 A1 | 7/2013 | Kleveland et al. | |
| 2014/0032826 A1 | 1/2014 | Lee et al. | |
| 2015/0378603 A1 | 12/2015 | Dearth et al. | |
| 2016/0118983 A1* | 4/2016 | Cho | H03K 19/0005 326/30 |
| 2017/0162276 A1 | 6/2017 | Ok et al. | |
| 2018/0286467 A1* | 10/2018 | Arai | G11C 29/028 |
| 2019/0052268 A1* | 2/2019 | Lee | G11C 7/1057 |
| 2019/0088348 A1 | 3/2019 | Jain et al. | |

\* cited by examiner

*Primary Examiner* — Han Yang

(74) *Attorney, Agent, or Firm* — Myers Bigel, P.A.

(57) ABSTRACT

A method and a memory device for testing and repairing memory cells during a power-up sequence are provided. The memory device includes a built-in self test (BIST) unit for testing a memory cell array during the power-up sequence. The BIST unit performs a test on the memory cell array in response to a power stabilization signal, or performs a test on the memory cell array in response to an impedance control (ZQ) calibration command. The BIST unit terminates a test being performed in response to a write leveling command, or terminates a test being performed in response to an active command.

20 Claims, 8 Drawing Sheets

US 10,957,414 B1

METHOD OF TEST AND REPAIR OF MEMORY CELLS DURING POWER-UP SEQUENCE OF MEMORY DEVICE

CROSS-REFERENCE TO RELATED APPLICATION

This application claims the benefit of Korean Patent Application No. 10-2019-0108457, filed on Sep. 2, 2019, in the Korean Intellectual Property Office, the disclosure of which is incorporated herein in its entirety by reference.

BACKGROUND

The inventive concept relates to a memory device, a memory module, and a memory test method, and more particularly, to ensuring operational stability of a memory device by testing and repairing a memory cell during a power-up sequence.

At a booting of a computing system, trainings and/or tests are performed, as a portion of a power-on self test (POST), on devices such as memory modules and graphics cards in the computing system. In the POST, trainings and/or tests of the memory module mounted with dynamic random access memory (DRAM) include interface tuning tasks for parameters related to an interface between a central processing unit (CPU) and DRAM, such as clock training, write/read leveling, write/read de-skew, and write/read centering. The tests for a DRAM cell are performed in a data write/read operation after the interface tuning operations are completed. When a DRAM cell failure occurs, there may be performance degradation of the memory module caused by the DRAM cell failure.

Accordingly, there is a need for repairing defective cells by testing the DRAM cell during the power-up sequence.

SUMMARY

According to some embodiments of the inventive concept, there is provided a memory device including a memory core including a memory cell array; an impedance control (ZQ) engine configured to perform a ZQ calibration operation by using a ZQ resistor connected to a ZQ terminal, in response to a ZQ calibration command, and a built-in self test (BIST) unit configured to generate a test enable signal in response to the ZQ calibration command, and configured to start a first test including testing of the memory cell array based on the test enable signal.

According to some embodiments of the inventive concept, there is provided a method of operating a memory device in which a built-in self test (BIST) unit is configured to test a memory core that is embedded in the memory core. The method includes receiving an impedance control (ZQ) calibration command from outside the memory device, performing a ZQ calibration operation in response to the ZQ calibration command, generating a test enable signal in response to the ZQ calibration command, and starting, by the BIST unit, a first test of the memory core.

According to some embodiments of the inventive concept, there is provided a memory device including a memory core including a memory cell array, an impedance control (ZQ) engine configured to perform a ZQ calibration operation by using a ZQ resistor connected to a ZQ terminal, in response to a ZQ calibration command, a built-in self test (BIST) unit configured to generate a test enable signal in response to the ZQ calibration command, and configured to start a first test including testing of the memory cell array based on the test enable signal. The BIST unit includes as a result of the first test, a fail cell table configured to store information about a fail cell having defective characteristics in the memory cell array, a training unit configured to perform a memory core parameter training related with the memory core in response to a training command and a periphery circuit parameter training for other periphery circuits not including the memory core in the memory device, and a built-in self repair (BISR) unit configured to replace the fail cell with a redundancy cell by using the redundancy cell that in the memory cell array.

According to some embodiments of the inventive concept, there is provided a memory module including a printed circuit board, a plurality of memory devices coupled to the printed circuit board, and a controller configured to control the plurality of memory devices. Each of the plurality of memory devices further includes a memory core including a memory cell array, an impedance control (ZQ) engine that is configured to perform a ZQ calibration operation by using a ZQ resistor connected to a ZQ terminal, in response to a ZQ calibration command, and a built-in self test (BIST) unit configured to generate a test enable signal in response to the ZQ calibration command. The BIST is configured to start a first test including testing of the memory cell array based on the test enable signal.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
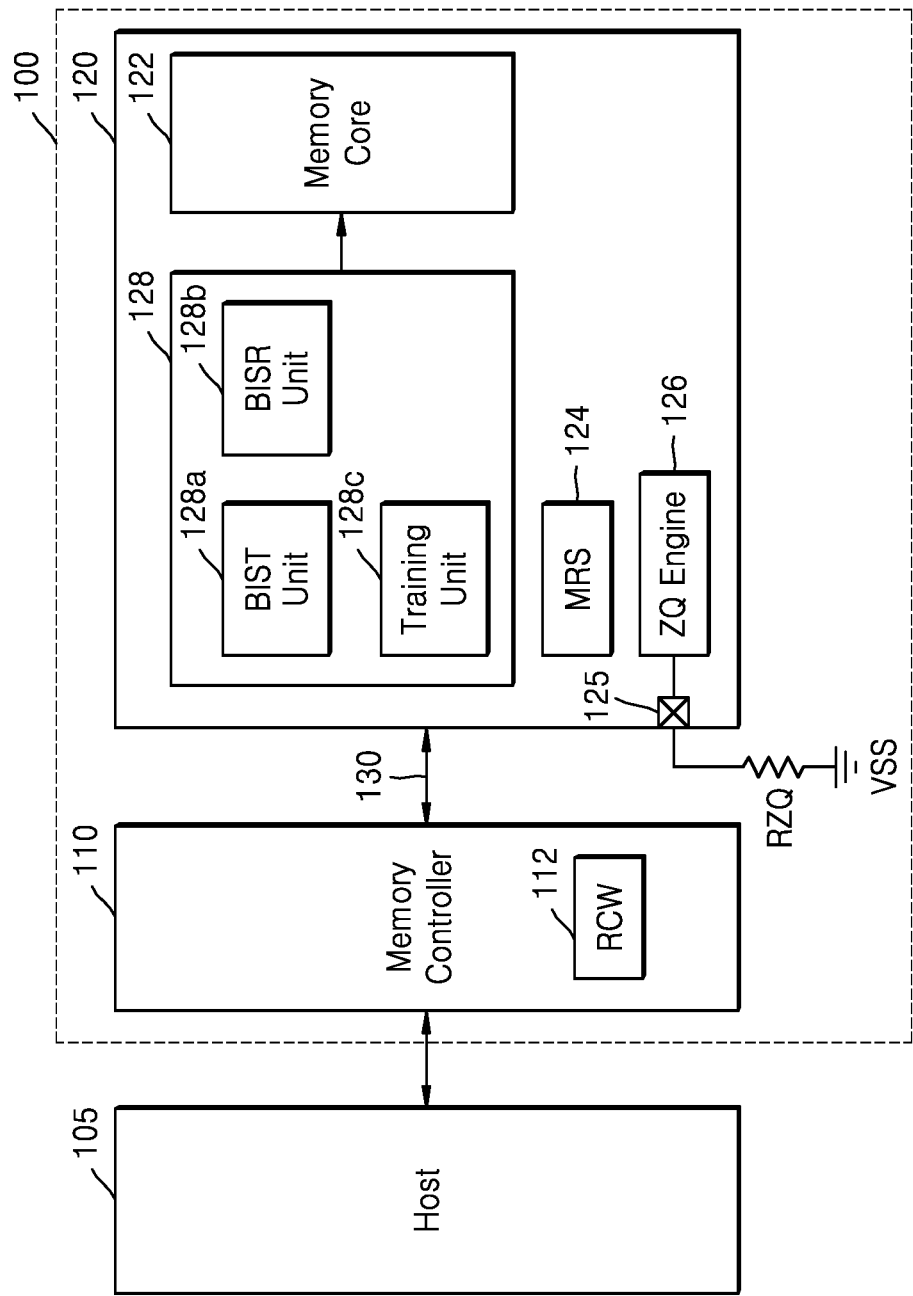
FIG. 1 is a block diagram illustrating a memory system, according to example embodiments of the inventive concept.

FIG. 1 is a block diagram illustrating a memory system 100 according to example embodiments of the inventive concept.

Referring to FIG. 1, the memory system 100 may include a memory controller 110 and a memory device 120. The memory device 120 may include, for example, dynamic random access memory (DRAM), and the memory controller 110 may control an operation of DRAM. The memory controller 110 may operate as a register clock driver (RCD) that provides a clock signal and a command/address signal to the memory device 120. In some embodiments, the controller 110 may be labeled as the RCD 110. The memory system 100 may be implemented with any type of memory module. For example, the memory system 100 may be implemented as a dual in-line memory module (DIMM) such as an un-buffered dual in-line memory module (UDIMM), registered DIMM (RDIMM), load reduced DIMM (LRDINM), fully buffered DIMM (FBDIMM), small outline DIMM (SODIMM), and/or the like.

The memory system 100 may be coupled to a host 105 and be accessed by the host 105. The host 105 may include a computing system. For example, the host 105 may include a processor, a micro control unit (MPU), and/or a central processing unit (CPU) that executes various computing functions such as specific calculations or tasks. A processor may include a single core processor or a plurality of multi-core processors such as dual-core, quad-core, and hexa-core processors. The processor may further include a cache memory. According to some embodiments, the host 105 may include a server, a server array or a server farm, a web server, a network server, an internet server, a workstation, a mini-computer, a mainframe computer, a web appliance, or a combination thereof. In some embodiments, one memory device 120 in the memory system 100 is described. However, the scope of the inventive concept is not limited thereto, and the memory system 100 may include various numbers of memory devices 120. In addition, the memory system 100 may include different memory devices and/or memory modules.

Some examples may be described by using expressions of "connected" and/or "coupled" along with their derivatives. These terms may not be necessarily intended as synonyms of each other. For example, descriptions using the terms "connected" and/or "coupled" may indicate that two or more elements are in direct physical or electrical contact with each other. In addition, the term "combined" may also mean that two or more elements are not in direct contact with each other but still cooperate or interact with each other.

The memory controller 110 may include a register control word (RCW) 112 for controlling the memory controller 110 to match an initialization and/or operation characteristics of the memory device 120. The RCW 112 may include various algorithms configuring the memory controller 110 such that the memory controller 110 is capable of normally interoperating with the memory device 120. For example, codes indicating frequency, timing, driving, detailed operating parameters, and the like of the memory device 120 may be set in the RCW 112. A built-in self test (BIST) and/or training of the memory device 120 may be performed by the RCW 112 code.

The memory controller 110 may be connected to the memory device 120 via a memory interface 130. For drawing simplicity, the memory interface 130 is illustrated as connecting, as one signal line, the memory controller 110 to the memory device 120, but may actually connect the memory controller 110 to the memory device 120 via a plurality of signal lines. The memory interface 130 may include connectors for connecting the memory controller 110 to the memory device 120. The connectors may be implemented as pins, balls, signal lines, and/or other hardware components. For example, clocks, commands, addresses, data, and the like may be transmitted and/or received between the memory controller 110 and the memory device 120 via the memory interface 130.

The memory device 120 may include a memory core 122, a mode register set (MRS) 124, an impedance control (ZQ) engine 126, and a test control unit 128.

Figure 4:
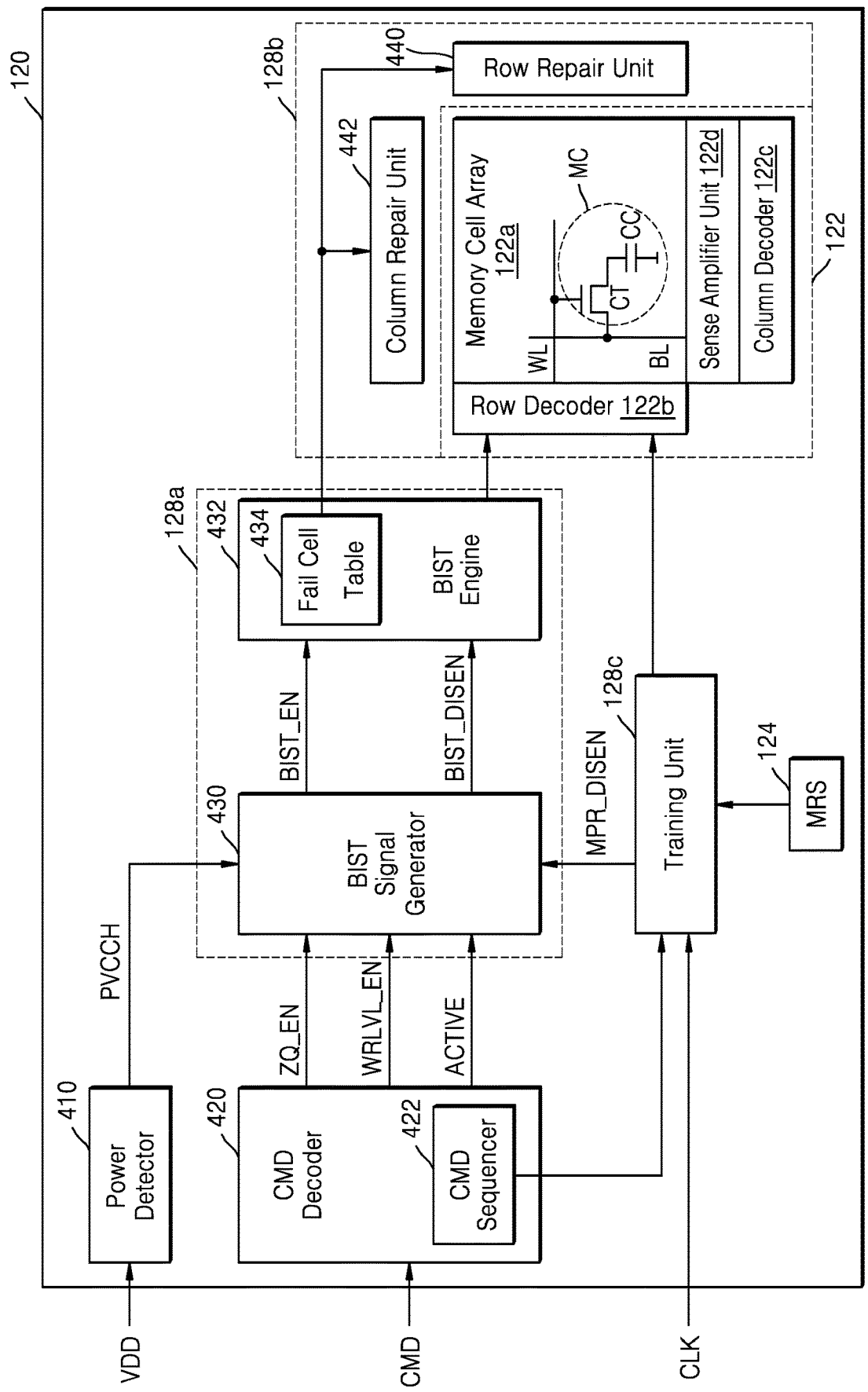
FIG. 4 is a block diagram illustrating a memory device in FIG. 1, according to example embodiments of the inventive concept.

The memory core 122 may include a memory cell array (122a, FIG. 4), a row decoder (122b, FIG. 4), a column decoder (122c, FIG. 4), and a sense amplifier unit (122d, FIG. 4). The memory cell array 122a may include a plurality of word lines (WL) and a plurality of bit lines (BL), and a plurality of memory cells (MC) formed at points where the word lines (WL) intersect with the bit lines (BL). The row decoder 122b may enable the word line (WL) corresponding to a row address. The sense amplifier unit (122d) may sense and amplify data of memory cells (MC) connected to the enabled word line and transmit the amplified data of the memory cells (MC) to the bit lines (BL). The column decoder 122c may, in a burst mode, gradually increase the received column address, and select the bit lines (BL) corresponding to the gradually increased column address. The memory core 122 may be, in response to the BIST enable signal (BIST_EN, FIG. 4), selectively controlled in a normal operation mode for performing a write/read operation or in a test operation mode for performing the BIST. When the BIST enable signal BIST_EN is activated, the BIST for the memory core 122 may be performed. The BIST enable signal BIST_EN may be generated by the BIST unit (128a, FIG. 4) in the test control unit 128.

The MRS 124 may be programmed to set a plurality of operation options, various functions, characteristics, and/or modes of the memory device 120. The MRS 124 may be programmed with appropriate bit values provided to an address bus of the memory interface 130 when an MRS command is issued by the memory controller 110.

As an example, the MRS 124 may be used to control a burst length (BL), a column access strobe (CAS) latency (CL), a write leveling enable/disable, a data terminal reference voltage (VrefDQ) training, and the like. The BL may be provided to set the maximum number of column locations that may be accessed with respect to read and/or write commands. The CL may be provided to define a clock cycle delay between the read command and a first bit of valid output data. The write leveling may be provided to enable or disable skew compensation between a clock signal and a data strobe signal during the write operation. The VrefDQ training may be provided to set a reference voltage for reading data that is input to or output from data (DQ) terminals. The VrefDQ training may be performed based on a power supply voltage (VDDQ) driving input/output buffers connected to the DQ terminals.

In addition, the MRS 124 may be used to control a delay locked loop (DLL) reset, a DLL enable/disable, output drive strength, additive latency, a termination data strobe (TDQS) enable/disable, an input/output buffer enable, a CAS light latency, a dynamic termination, light cyclic redundancy check (CRC), a multi-purpose register (MPR) location function, an MPR operation function, a gear down mode, an MPR read format, a power-down mode, a reference voltage (Vref) monitoring, a read preamble training mode, a read preamble function, a write preamble function, a command and address (C/A) parity function, a CRC error state, a C/A parity error state, an on die termination (ODT) function, a data mask function, a write data bus inversion (DBI) function, a read DBI function, an error detection code (EDC) hold pattern, and/or the like, which are related to general functions, characteristics, and modes of DRAM.

The ZQ engine 126 may control impedance matching of signal lines that transmit commands, addresses, and/or data via the memory interface 130. To reduce a transmission time of signals transmitted via the memory interface 130, a swing width of the signals may be reduced. Swing width may be a difference from the lowest amplitude to the highest amplitude of the signal. As the swing width of the signals is reduced, influence of external noise on the memory device 120 may be increased, and signal reflection caused by an impedance mismatch in the memory interface 130 may become more severe or a more relevant consideration. To solve the impedance mismatch, the memory device 120 may include a ZQ terminal 125, receive a ZQ calibration command from the memory controller 110, and control impedance matching by performing a ZQ calibration operation. A resistor RZQ may be connected between the ZQ terminal 125 and the ground voltage VSS. A value of the resistor RZQ may be, for example, about 240Ω.

The test control unit 128 may include a BIST unit 128a, a built-in self repair (BISR) unit 128b, and a training unit 128c. The BIST unit 128a may start a first test that performs a memory full cell test on the memory core 122 in response to the ZQ calibration command. The BIST unit 128a may start a second test that performs a test on the memory core 122 in response to a power stabilization signal PVCCH of the memory device 120. The BIST unit 128a may test the memory core 122 by selecting one of the first test and the second test. The BIST unit 128a may store information about a defective cell having a defective characteristic in the memory core 122, as a result of the first test and/or the second test.

The BISR unit 128b may replace the defective cell with a redundancy cell by using the redundancy cell included in the memory core 122. The BISR unit 128b may store information about the defective cell that has been repaired with the redundancy cell, together with information about the defective cell.

In response to the training command, the training unit 128c may perform a memory core parameter training related with the memory core 122 and/or a periphery circuit parameter training for other periphery circuits beyond the memory core 122 in the memory device 120. The training unit 128c may, as a training subject, determine an optimal parameter for a memory core parameter and/or a periphery circuit parameter. In some embodiments, the training unit 128c is described as being included in the memory device 120. However, the training unit 128c may be included in the memory controller 110, and the memory controller 110 may, as a training subject, perform a memory training.

Figure 2:
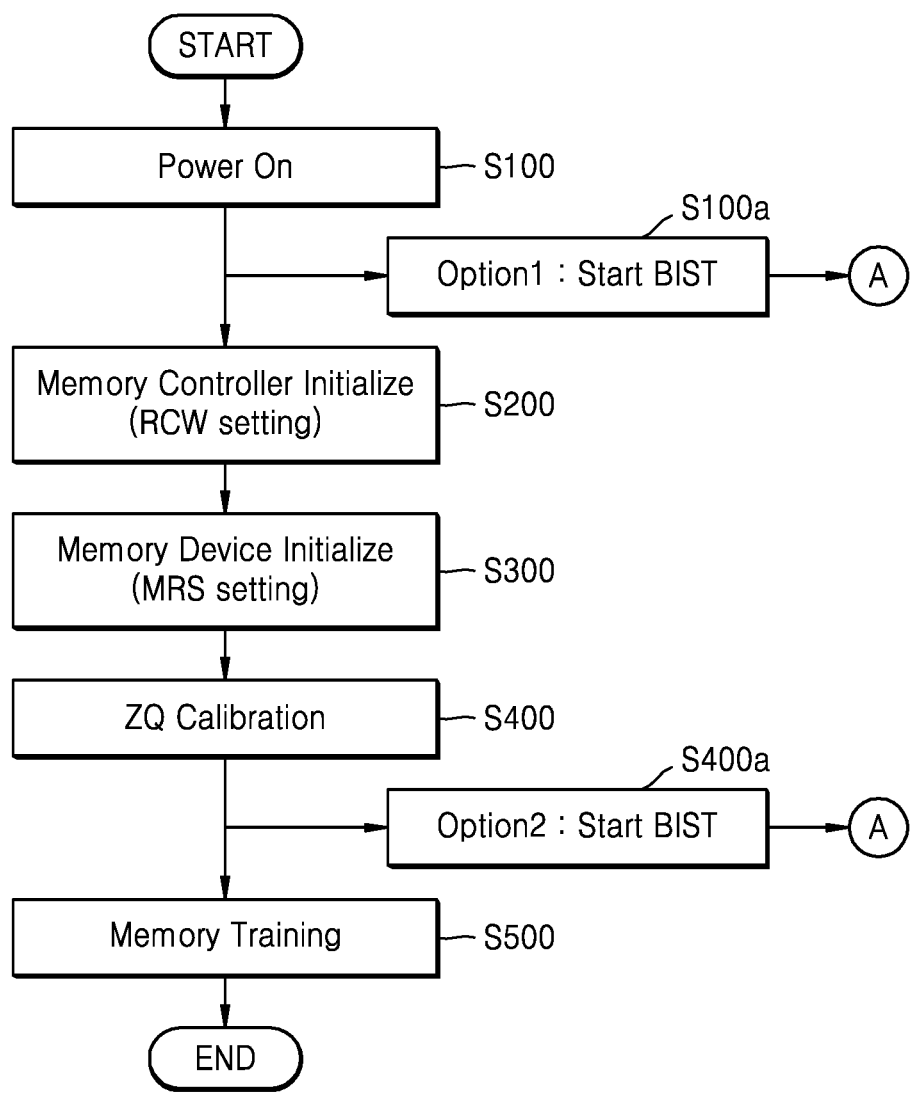
FIG. 2 is a flowchart of a power-up sequence of the memory system in FIG. 1, according to example embodiments of the inventive concept.

FIG. 2 is a flowchart of a power-up sequence of the memory system 100 in FIG. 1.

Referring to FIG. 2, power may be supplied to the memory system 100 such that the memory system 100 may be powered up (S100). When the memory system 100 is powered up and a level of a power supply voltage (VDD, FIG. 4) driving the memory device 120 is maintained stable, the memory device 120 may supply the power stabilization signal (PVCCH, FIG. 4). The memory device 120 may control the memory device 120 to be in an operable state by using the power stabilization signal PVCCH. In this case, the memory device 120 may start the BIST by using the BIST unit 128a that responds to the power stabilization signal PVCCH, as a first option of starting the BIST (S100a).

After the memory system 100 is powered up, the memory controller 110 may set the RCW 112 for controlling the memory device 120 to match the initialization and/or operation characteristics of the memory device 120 (S200). The RCW 112 may store codes indicating frequency, timing, driving, detailed operation parameters, and the like of the memory device 120 such that the memory controller 110 interacts with the memory device 120 in a normal manner.

The memory device 120 may set the MRS 124 to a plurality of operation options, various functions, characteristics, and modes of the memory device 120 (S300). In the MRS 124, codes for setting the BL, the CL, the MPR operation function, the MPR read format, the write leveling, the VrefDQ training, the read/write DBI function, and the like may be set.

The memory device 120 may receive the ZQ calibration command from the memory controller 110 and perform the ZQ calibration operation by using the ZQ engine 126 (S400). In this case, the memory device 120 may, as a second option, start the BIST by using the BIST unit 128a that responds to the ZQ calibration command (S400a). In this case, the BIST unit 128a of the memory device 120 may need to be configured such that the BIST does not start in response to the power stabilization signal PVCCH in operation S100a.

The ZQ engine 126 may generate a pull-up calibration code by performing a pull-up calibration on the resistor RZQ connected to the ZQ terminal 125 and on a pull-up resistor in the ZQ engine 126, or may generate a pull-down calibration code by performing a pull-down calibration on the pull-up resistor and a pull-down resistor in the ZQ engine 126. The pull-up calibration code and/or the pull-down calibration code may be provided to input/output buffers. The input/output buffers may adjust a termination resistance value according to the pull-up and/or pull-down calibration codes.

The ZQ calibration operation performed after the power-up of the memory system 100 may need to be completed during a time period specified by a standard related to the ZQ calibration command. For example, the ZQ calibration operation may be completed within about 512 clock cycles.

After the ZQ calibration operation is performed, the memory device 120 may, as an interface tuning operation in the memory interface 130, perform the memory training by using the training unit 128c (S500). The memory device 120 may perform, for example, a clock training, an address training, a write/read leveling, a write/read re-center training, and/or the like.

Figure 3:
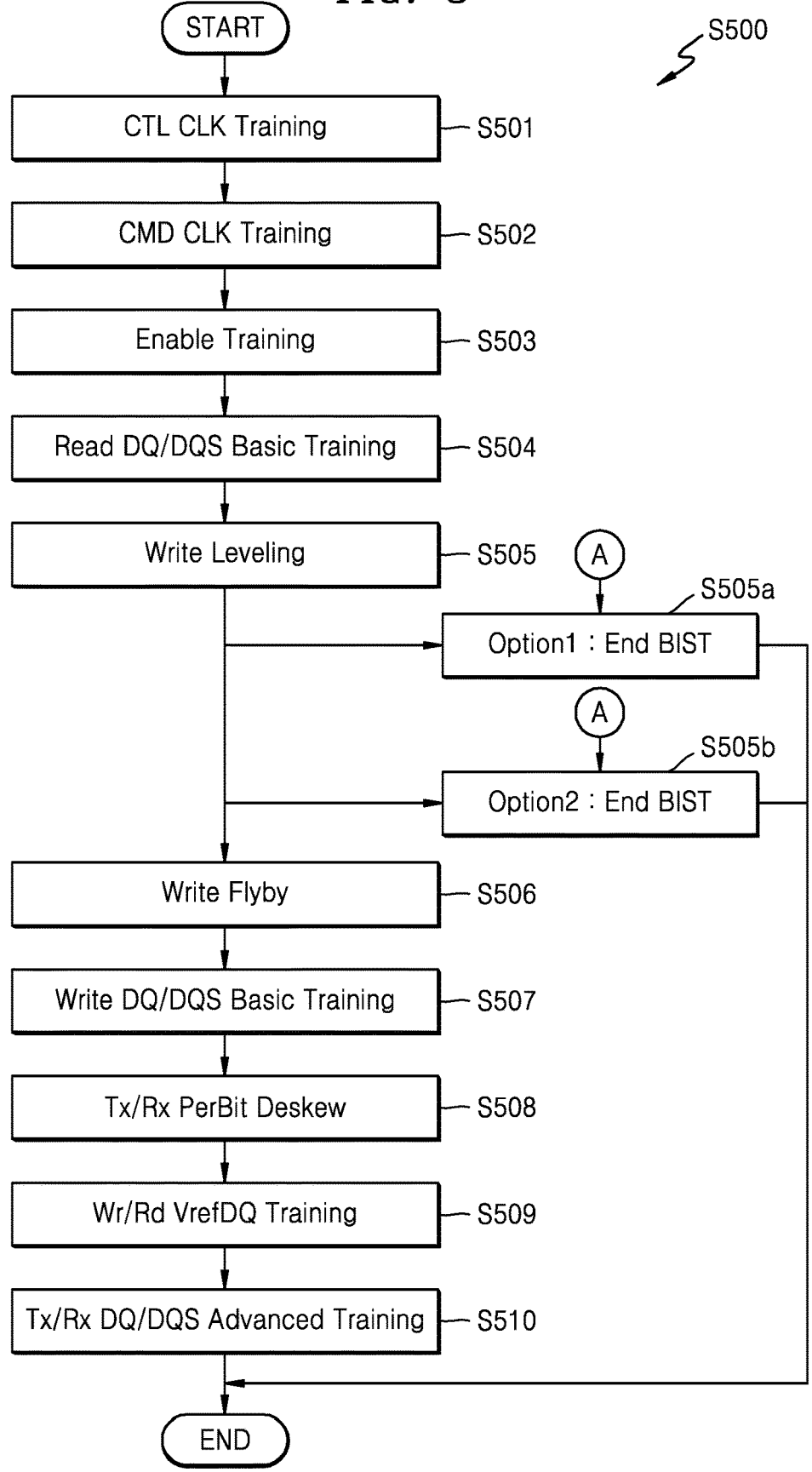
FIG. 3 is a flowchart of a memory training in FIG. 2, according to example embodiments of the inventive concept.

FIG. 3 is a flowchart of the memory training operation S500 in FIG. 2.

Referring to FIG. 3, the memory device 120 may perform the clock training on control signals CTL received via the memory interface 130 (S501). The control signals CTL may include a chip select signal CS, a clock enable signal CKE, a row address strobe signal RAS, the CAS, a write enable signal WE, and/or the like. The clock training may be performed such that the control signals CTL transmitted from the memory controller 110 are received by the memory device 120 in synchronization with a clock signal CLK.

The memory device 120 may perform the clock training on commands CMD received via the memory interface 130 (S502). The commands CMD may include a precharge command, an active command, a read command, a write command, and/or the like. The clock training may be performed such that the commands CMD transmitted from the memory controller 110 are received by the memory device 120 in synchronization with a clock signal CLK.

The memory device 120 may train a receive enable for recognizing a signal received via the memory interface 130 (S503). The memory device 120 may provide a receive enable signal for recognizing reception of signals transmitted from the memory controller 110 to the training unit 128c. The training unit 128c may include a buffering circuit and a timing circuit to maintain an assertion of the receive enable signal to be consistent with transmission of the signal from the memory controller 110. In the training unit 128c, an assertion of timing of the receive enable signal may be determined in the receive enable training process.

The memory device 120 may perform a basic data strobe signal DQS training on the data DQ output via the memory interface 130 (S504). When the data strobe signal DQS is output to the memory controller 110 together with the data DQ, the memory device 120 may perform the read re-center training such that an edge of the data strobe signal DQS is centered in a window of the data DQ.

The clock training for the control signals CTL in operation S501, the clock training for the commands CMD in operation S502, the receive enable training in operation S503, and/or a training of the data strobe signal DSQ for the data DQ in operation S504 may be performed by using the MPR operation function and the MPR read format of the MRS 124. The clock training for the control signals CTL, the clock training for the commands CMD, and the receive enable training may be performed by reading a timing calibration bit sequence preset in the MPR. In addition, the training of the data strobe signal DQS on the data DQ may be performed by reading a data pattern preset in the MPR.

The trainings of operations S501 through S504 may be periphery circuit parametric trainings by using the MPR, but not using the memory core 122. When the periphery circuit parameter training is completed, the training unit 128c may determine that a training using the MPR will no longer be performed. In this case, the training unit 128c may generate an MPR disable signal MPR_DISEN indicating not to use the MPR. The MPR disable signal MPR_DISEN may function as a base signal of an operation of terminating the BIST that is being performed by the BIST unit 128a.

The memory device 120 may receive the write leveling command related with the write operation from the memory controller 110 via the memory interface 130 and perform write leveling to compensate for the skew between the received clock signal CLK and the data strobe signal DQS (S505). The write leveling may be a function of sampling the data strobe signal DQS output from the memory controller 110 as the clock signal CLK, detecting a phase relationship between the data strobe signal DQS and the clock signal CLK, and adjusting the delay time of the data strobe signal DQS.

The memory device 120 may, as a first option of terminating the BIST, terminate the BIST performed by the BIST unit 128a based on the MPR disable signal MPR_DISEN and in response to the write leveling command (S505a).

According to the write operation related with the write leveling, an active command and a write command may be sequentially issued from the memory controller 110 to the memory device 120. The memory device 120 may access the memory core 122 in response to the active command. In this case, the memory device 120 may, as a second option of terminating the BIST, terminate the BIST performed by the BIST unit 128a based on the MPR disable signal MPR_DISEN and in response to the active command (S505b). In this case, the BIST unit 128a of the memory device 120 may need to be configured such that the BIST is not terminated in response to the write leveling command in operation S505a.

When the memory system 100 is implemented with a DIMM (720, FIG. 7), a plurality of memory devices 120 may be mounted on the memory system 100. In the memory interface 130, a multi-drop may be adopted in which a clock signal CLK line and a C/A signal line are wired to a plurality of memory devices 120 in a flyby topology, and the data DQ line and the data strobe signal DQS line are wired to each of the plurality of memory devices 120.

In the flyby topology, at the time of the write operation, when the clock signal CLK is input via the clock signal CLK line wired via a data chain to each of the memory devices 120, the data DQ and the data strobe signal DQS may be input to each of the memory devices 120. The data DQ and the data strobe signal DQS input to the memory device 120 to which the clock signal CLK is last input may be input with a significant delay to the memory device 120, compared with the data DQ and the data strobe signal DQS that are input to the memory device 120 to which the clock signal CLK is first input. Accordingly, each of the memory devices 120 may perform a write fly-by operation such that a time point at which the data strobe signal DQS arrives during the write operation satisfies a time point defined in the standard (S506).

The memory device 120 may perform the data strobe signal DQS training on the data DQ that is input via the memory interface 130 (S507). When the data strobe signal DQS is input together with the data DQ in the memory controller 110, the memory device 120 may perform the write re-center training such that the edge of the data strobe signal DQS is centered in the window of the data DQ.

The memory device 120 may perform a write/read data de-skew operation to reduce a time difference in the data input/output time between the data DQ that is either input or output via the memory interface 130 (S508). Since a valid data window is reduced when the skew between the write data DQ increases in the write mode, the memory device 120 may perform the write data de-skew operation for compensating for the data skew to secure a valid data margin. Since the valid data window is reduced when the skew between the input data DQ increases in the read mode, the memory device 120 may perform the read data de-skew operation for compensating for the data skew to secure a valid data margin or an improved data margin.

The memory device 120 may perform a VrefDQ training to set a level of the reference voltage VrefDQ for reading data DQ that is either input or output via the memory interface 130 (S509). The memory device 120 may perform training on a training value of the reference voltage VrefDQ, a range of the VrefDQ training, and/or the like.

As an example, a training value of the VrefDQ may be provided by being divided into a first range Range1 and a second range Range2 based on the VDDQ. In the first range Range1, a minimum operating voltage of the VrefDQ may be set to about 60% of the VDDQ, and a maximum operating voltage of the VrefDQ may be set to about 92% of the VDDQ, and in the second range Range2, the minimum operating voltage of the VrefDQ may be set to about 45% of the VDDQ, and the maximum operating voltage of the VrefDQ may be set to about 77% of the VDDQ. The memory device 120 may perform the VrefDQ training such that a VrefDQ level comes in the middle of a data DQ eye diagram that is seen as a superposition of a plurality of transitions of the data DQ.

It may be important to determine a time period during which the data DQ is valid so that the memory controller 110 properly identifies the data DQ read from the memory device 120. It may be important to determine a time period during which the data DQ that was written is valid so that the memory device 120 properly identifies the data DQ received from the memory controller 110. To this end, a certain preamble time indicating whether the data DQ is valid before inputting or outputting of the data DQ may be set to the data strobe signal DQS. The memory device 120 may perform a high level data strobe signal DQS training on the data DQ that is input or output via the memory interface 130 (S510).

The memory device 120 may perform the enable training such that the data strobe signal DQS has a one clock cycle preamble time or a two clock cycle preamble time, before inputting of the data DQ according to the write command or outputting of the data DQ according to the read command. The enable training for the data strobe signal DQS may perform an operation of adjusting the delay of the DLL until assertion of the enable signal matches a preamble indication in the data strobe signal DQS.

The trainings in operations S507 through S510 may be core parameter trainings using the memory core 122. The training unit 128c may complete the periphery circuit parameter training and the core parameter training, and then store an optimized periphery circuit parameter and an improved or optimized core parameter in a parameter storage area. The parameter storage area may be, for example, an extended mode register set (EMRS) or a separate parameter register, or a non-volatile memory such as a flash memory, erasable programmable read only memory (EPROM), and/or electrically EPROM (EEPROM). The memory device 120 may write and/or read data in an environment set with optimized or improved periphery circuit parameters and core parameters stored in the parameter storage area.

FIG. 4 is a block diagram illustrating the memory device 120 in FIG. 1.

Referring to FIG. 4, the memory device 120 may include the memory core 122, the MRS 124, the BIST unit 128a, the BISR unit 128b, the training unit 128c, a power detector 410, and a CMD decoder 420. The BIST unit 128a may include a BIST signal generator 430 and a BIST engine 432. The BISR unit 128b may include a row repair unit 440 and a column repair unit 442. Descriptions of the memory device 120 given with reference to FIG. 1 are omitted here for brevity, but may be applied to FIG. 4.

The power detector 410 may generate the power stabilization signal PVCCH by detecting that a power voltage VDD level is stably maintained according to power voltage levels after the power-up of the memory device 120. The memory device 120 may enter an operable state in response to the power stabilization signal PVCCH. The power stabilization signal PVCCH may be provided to the BIST signal generator 430 of the BIST unit 128a.

The command decoder 420 may receive commands CMD via the memory interface 130, and store the commands CMD in the command sequencer 422. The command sequencer 422 may queue the commands CMD issued to the memory device 120 according to the power-up sequence of the memory system 100 illustrated in FIG. 2. The command sequencer 422 may be configured to sequentially store a command such as an MRS command that includes instructions for setting of the MRS 124 in operation S300, a ZQ calibration command that includes instructions for a ZQ calibration operation in operation S400, a training command that includes instructions for a memory training in operation S500, a write leveling command, an active command, a write command, a read command, and/or the like. The memory device may be configured to sequentially store a write command, a read command, and/or the like and operate in a first in first out (FIFO) manner in which the stored commands are output in a storing order from the command decoder 420.

The command decoder 420 may generate control signals corresponding to the related commands CMD according to an output order from the command sequencer 422 and provide the control signals to the BIST signal generator 430 and/or the training unit 128c. The command decoder 420 may generate a ZQ calibration enable signal ZQ_EN based on a ZQ calibration command (ZQCL, FIG. 6), generate a write leveling enable signal WRLVL_EN based on the write leveling command WRLVL, and generate an active signal ACTIVE based on an active command ACT. The ZQ calibration enable signal ZQ_EN, the write leveling enable signal WRLVL_EN, and the active signal ACTIVE may be provided to the BIST signal generator 430 of the BIST unit 128a.

The BIST signal generator 430 may receive the power stabilization signal PVCCH, the ZQ calibration enable signal ZQ_EN, the light leveling enable signal WRLVL_EN, the active signal ACTIVE, and/or the MPR disable signal MPR_DISEN provided by the training unit 128c. Based on these signals, the BIST signal generator 430 may generate the BIST enable signal BIST_EN and a BIST disable signal BIST_DISEN. Conceptual embodiments of the BIST signal generator 430 are described with reference to FIGS. 5A through 5D.

Figure 5A:
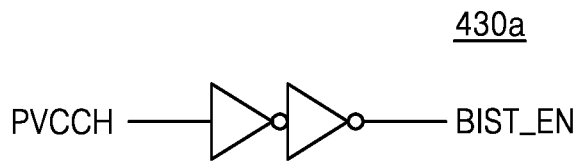
FIGS. 5A through 5D are circuit diagrams, according to embodiments of a built-in self test (BIST) signal generator in FIG. 4.

Referring to FIG. 5A, a BIST signal generator 430a may generate the BIST enable signal BIST_EN instructing the BIST engine 432 to start BIST in response to the power stabilization signal PVCCH. The BIST engine 432 may perform a memory full cell test to confirm whether all memory cells or substantially all of the memory cell array 122a normally operate in response to the BIST enable signal BIST_EN.

Figure 5B:
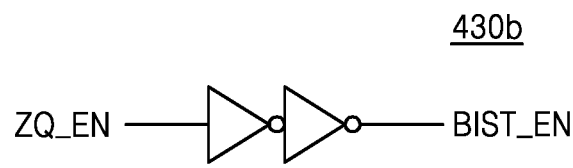

Referring to FIG. 5B, a BIST signal generator 430b may generate the BIST enable signal BIST_EN in response to the ZQ calibration enable signal ZQ_EN. In this case, only one of the BIST signal generator 430a of FIG. 5A and the BIST signal generator 430b of FIG. 5B may be selectively controlled to generate the BIST enable signal BIST_EN.

Figure 5C:
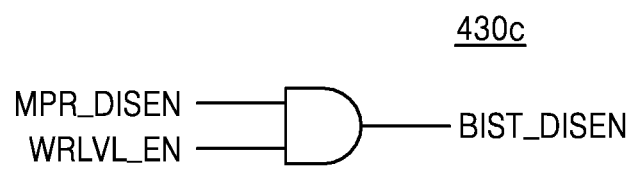

Referring to FIG. 5C, a BIST signal generator 430c may generate the BIST disable signal BIST_DISEN by performing an AND operation on the MPR disable signal MPR_DISEN and the write leveling enable signal WRLVL_EN. The BIST engine 432 may terminate the memory full cell test for the memory cell array 122a in response to the BIST disable signal BIST_DISEN.

Figure 5D:
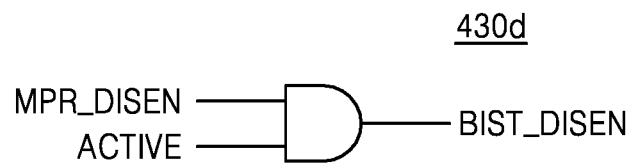

Referring to FIG. 5D, a BIST signal generator 430d may generate the BIST disable signal BIST_DISEN by performing an AND operation on the MPR disable signal MPR_DISEN and the active signal ACTIVE. In this case, one of the BIST signal generator 430c of FIG. 5C and the BIST signal generator 430d of FIG. 5D may be selectively controlled to generate the BIST disable signal BIST_DISEN.

Referring again to FIG. 4, the BIST enable signal BIST_EN and the BIST disable signal BIST_DISEN generated by the BIST signal generator 430 may be provided to the BIST engine 432.

The BIST engine 432 may provide various test algorithms to test functionality and reliability of the memory core 122. The BIST engine 432 may interpret and execute test algorithms to control a sequence of test patterns and application timing. The BIST engine 432 may, to detect any possible memory defects, write various test pattern data to the memory core 122 and read the written test pattern data from the memory core 122. By comparing the test pattern data with the data read from the memory core 122, the BIST engine 432 may determine whether any memory cell of the memory core 122 is defective.

The BIST engine 432 may be configured to change direct current (DC) parameters and/or alternating current (AC) parameters during the BIST and program user set test sequences. The DC parameter may include an operating voltage VINTA, a bit line voltage VBL, and the like of the memory cell array 122*a*. The AC parameter may include a row command delay time tRCD, a write recovery time tWR, a write latency, and/or the like.

The BIST engine 432 may provide flexibility to test various kinds of test sequences. For example, it may be necessary to ensure that a data retention time of the memory cells (MC) of the memory cell array 122*a* has more than a refresh time interval defined in the standard. The data retention test may charge a memory cell capacitor (CC) with a voltage of logic '1' by turning on a memory cell transistor (CT). After the memory cell transistor (CT) is turned off, the BIST engine 432 may allow the memory cell capacitor (CC) to remain in a state of being charged with the voltage of logic '1' (this state is referred to as a pause), and may determine a logic '1' or '0' in the sense amplifier of memory core 122 by reading a potential of the memory cell capacitor (CC). During the pause, a leakage current may occur due to a reverse bias occurring at the PN junction between a storage node of the memory cell capacitor and a semiconductor substrate. Since the charge stored in the memory cell capacitor (CC) is lost due to the leakage current, it may be necessary to perform data refresh (a repetitive operation of read/write) at regular time intervals for data retention. Refresh characteristics of the memory cells may deteriorate at a high temperature. Accordingly, the BIST engine 432 may screen a retention failure while changing a pause time according to the temperature of the memory device 120 by using a temperature sensor in the memory device 120 when screening a refresh fail cell. In other words, as the temperature sensor indicates a change in temperature, the pause time may be modified. Subsequently a refresh fail test of the memory device 120 may be performed to screen for changes in characteristics due to the temperature change.

The BIST engine 432 may perform the memory full cell test on the memory cell array 122*a* in response to the BIST enable signal BIST_EN and terminate the memory full cell test in response to the BIST disable signal BIST_DISEN. As a result of the memory full cell test, fail cells having deterioration of element characteristics such as, for example, cells having a short refresh time, cells having deteriorated cell write characteristics, and/or cells showing variable retention time may appear. The BIST engine 432 may store information about the fail cells having such defective characteristics in the fail cell table 434. The fail cell table 434 may use a fuse array or an anti-fuse array. The fail cell information stored in the fail cell table 434 may be provided to the BISR unit 128*b* to aide in the repair process.

The BISR unit 128*b* may repair the fail cell by using the redundancy cell included in the memory cell array 122*a* to repair the fail cell. The BISR unit 128*b* may replace the fail cell with the redundancy cell by using the row repair unit 440 and the column repair unit 442. For example, the BISR unit 128*b* may replace a memory cell group in which the fail cell has occurred with a redundancy memory cell group. When the fail cell is generated from the memory cell connected to the bit line, the BISR unit 128*b* may replace the memory cells connected to the bit line with the memory cells connected to the redundancy bit line. The BISR unit 128*b* may replace the memory cells connected to a portion (a bit line segment) of the bit line where the fail cell has been generated, with the memory cells connected to a portion of the redundancy bit line. In some embodiments, the BISR unit 128*b* may replace the fail cell with the redundancy cell. The row repair unit 440 and the column repair unit 442 may generate the row address and the column address by replacing an address indicating the redundancy cell for repairing the fail cell.

In the BISR unit 128*b*, information that the fail cell has been repaired by the redundant cell may be stored together with an indication referring to the corresponding fail cell information stored in the fail cell table 434 of BIST Engine 432. Information stored in the fail cell table 434 may be read by the memory controller (110, FIG. 1) or the host (105, FIG. 1). The memory controller 110 or the host 105 may control the memory device 120 to normally interact with the memory device 120 by using the information stored in the fail cell table 434 and/or information regarding repairs by the redundant cells in the BISR unit 128*b*.

Figure 6:
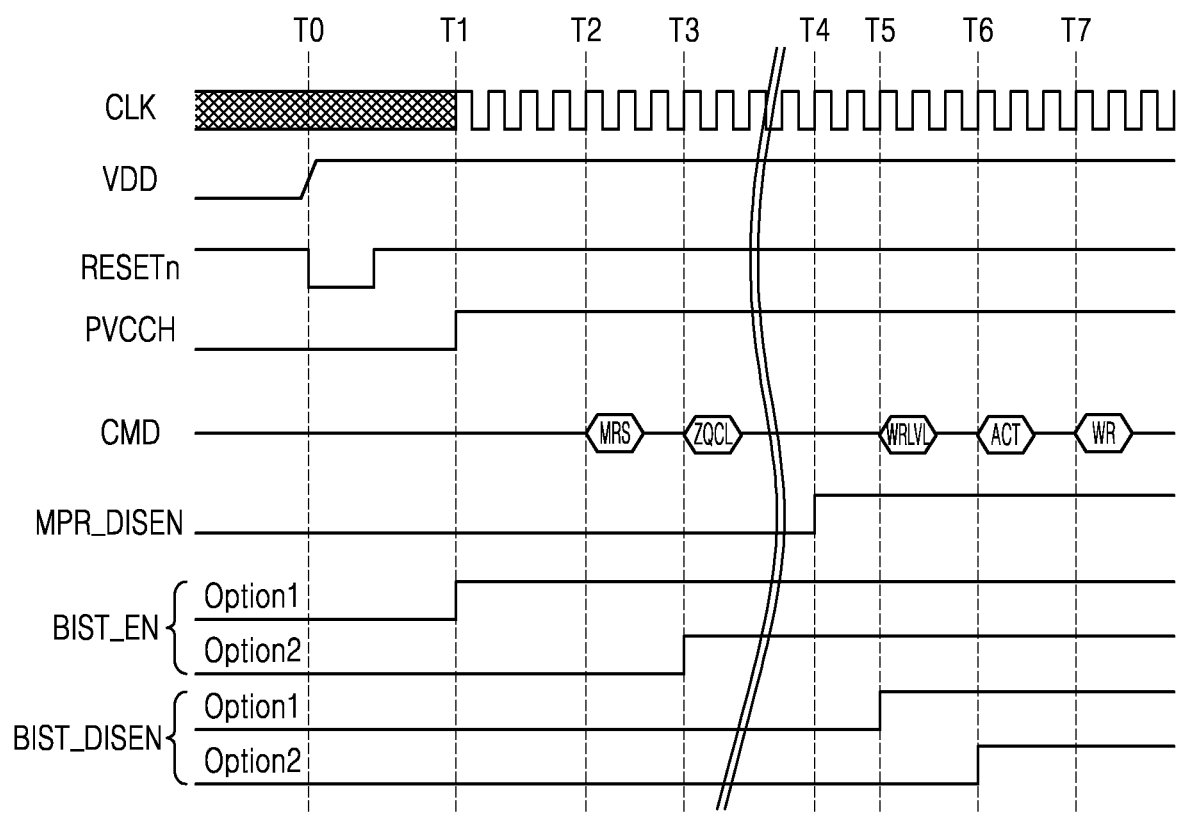
FIG. 6 is an operation timing diagram according to a power-up sequence of the memory device of FIG. 4, according to example embodiments of the inventive concept.

FIG. 6 is an operation timing diagram according to the power-up sequence of the memory device 120 of FIG. 4. FIG. 6 illustrates a timing diagram in which the memory device 120 operates based on a clock signal CLK according to communication protocols or standards. It is noted that the timing diagrams described in the inventive concept are not necessarily drawn to scale.

Referring to FIGS. 2, 3, 4, and 6, at a time point T0, the power supply voltage VDD may be applied to the memory device 120 according to the power-up of the memory device 120. After the power supply voltage VDD is stabilized and a reset signal RESETn is maintained at a logic low level for a certain period of time to allow for power stability, the reset signal RESETn may be toggled. The reset signal RESETn may include a signal that initializes the memory device 120 to a reset operation for correct operations thereof.

After the reset operation of the memory device 120, the commands CMD issued to the memory device 120 may be sequentially stored in the command sequencer 422 according to the power-up sequence (FIGS. 2 and 3) of the memory system 100. The command sequencer 422 may sequentially store the MRS command for instructing the setting of the MRS 124 (S300), the ZQ calibration command ZQCL for instructing the ZQ calibration operation, the write leveling command WRLVL, the active command ACT, a write command WR, a read command RD, and/or the like. The command sequencer 422 may sequentially output corresponding commands in the storing order.

At a time point T1, the power detector 410 may detect that a level of the power supply voltage VDD is stably maintained at a target voltage level and may trigger the power supply stabilization signal PVCCH to a logic high level. The BIST signal generator (430*a*, FIG. 5A) may transition to a logic high level the BIST enable signal BIST_EN that instructs the BIST engine 432 to start the BIST in response to the triggering of the power stabilization signal PVCCH. The BIST enable signal BIST_EN generated based on the power stabilization signal PVCCH may function as the first option signal for starting the BIST. The BIST engine 432 may start the BIST for the memory core 122 in response to the BIST enable signal BIST_EN of the first option. The BIST engine 432 may perform programmed test sequences and subsequently store in the fail cell table 434 information about the fail cells exhibiting the defective characteristics in the memory cell array 122*a*. The BISR unit 128*b* may repair the fail cells by using the redundant cells according to the fail cell information stored in the fail cell table 434.

At a time point T2, the MRS command stored in the command sequencer 422 may be output. The MRS 124 may be programmed with appropriate bit values provided to an address bus of the memory interface 130 in response to the MRS command. The MRS 124 may set operation options such as the burst length BL, the CAS latency CL, the MPR operation function, the MPR read format, the write leveling, the VrefDQ training, the read/write DBI function, various functions, characteristics, and/or modes of the memory device 120.

At a time point T3, the ZQ calibration command ZQCL stored in the command sequencer 422 may be output. The ZQ engine 126 may generate pull-up/pull-down calibration codes by using the resistor RZQ connected to the ZQ terminal 125 in response to the ZQ calibration command ZQCL and performing pull-up/pull-down calibrations. The pull-up/pull-down calibration codes may be provided to the input/output buffers to adjust a termination storage value of the input/output buffers connected to the DQ terminals. The command decoder 420 may generate the ZQ calibration enable signal ZQ_EN based on the ZQ calibration command ZQCL. The BIST signal generator (430b, FIG. 5B) may transition the BIST enable signal BIST_EN to a logic high level so that the BIST engine 432 starts the BIST in response to the ZQ calibration enable signal ZQ_EN. The BIST enable signal BIST_EN generated based on the ZQ calibration enable signal ZQ_EN may function as the second option signal for starting the BIST. The BIST engine 432 may start the BIST for the memory core 122 in response to the BIST enable signal BIST_EN of the second option. The BIST engine 432 may perform the programmed test sequences and store information about the fail cells having defective characteristics in the memory cell array 122a in the fail cell table 434. The BISR unit 128b may then repair the fail cells by using the redundancy cells according to the stored information about the fail cells from the fail cell table 434.

After the ZQ calibration operation is performed, the memory device 120 may perform the memory training by using the training unit 128c. The training unit 128c may perform, for example, clock training, address training, write/read leveling, write/read re-center training, etc. When performing the memory training, the training unit 128c may perform the memory training by reading a data pattern preset in the MPR of the MRS 124. For example, the periphery circuit parameter training such as the receive enable training (S503) or the data strobe signal DQS training (S504) for data DQ may be executed by reading the timing calibration bit sequence preset in the MPR.

At a time point T4, when the periphery circuit parameter training is completed, the training unit 128c may trigger the MPR disable signal MPR_DISEN, which indicates training is no longer performed by using the MPR. In other words, the MPR is in a state of non-use by setting the MPR_DISEN to a logic high level. The MPR disable signal MPR_DISEN may be provided to the BIST signal generators (430c of FIG. 5C and 430d of FIG. 5D).

At a time point T5, the write leveling command WRLVL stored in the command sequencer 422 may be output by the command decoder 420. The training unit 128c may perform write leveling to compensate for skew between the clock signal CLK and the data strobe signal DQS in response to the write leveling command WRLVL.

The command decoder 420 may generate the write leveling enable signal WRLVL_EN based on the write leveling command WRLVL. The BIST signal generator (430c of FIG. 5C) may generate the BIST disable signal BIST_DISEN at a logic high level by performing an AND operation on the MPR disable signal MPR_DISEN and the write leveling enable signal WRLVL_EN. The BIST disable signal BIST_DISEN generated based on the write leveling enable signal WRLVL_EN may function as the first option signal for terminating the BIST. The BIST engine 432 may terminate the BIST for the memory core 122 in response to the BIST disable signal BIST_DISEN of the first option.

At time points T6 and T7, the active command ACT and the write command WR according to the write operation related with the write leveling stored in the command sequencer 422 may be output, respectively. The command decoder 420 may generate the active signal ACTIVE based on the active command ACT. The BIST signal generator (430c of FIG. 5C) may generate the BIST disable signal BIST_DISEN a logic high level by performing an AND operation on the MPR disable signal MPR_DISEN and the active signal ACTIVE. The BIST disable signal BIST_DISEN generated based on the active signal ACTIVE may function as the second option signal for terminating the BIST. The BIST engine 432 may terminate the BIST for the memory core 122 in response to the BIST disable signal BIST_DISEN of the second option.

Thereafter, the training unit 128c may perform training of the data strobe signal DQS on the data DQ, a de-skew operation of the data DQ, VrefDQ training, and data strobe signal DQS training for setting the preamble time. The memory device 120 may be configured to write or read data in an environment set with optimized operation parameters by utilizing training result values of the training unit 128c.

Figure 7:
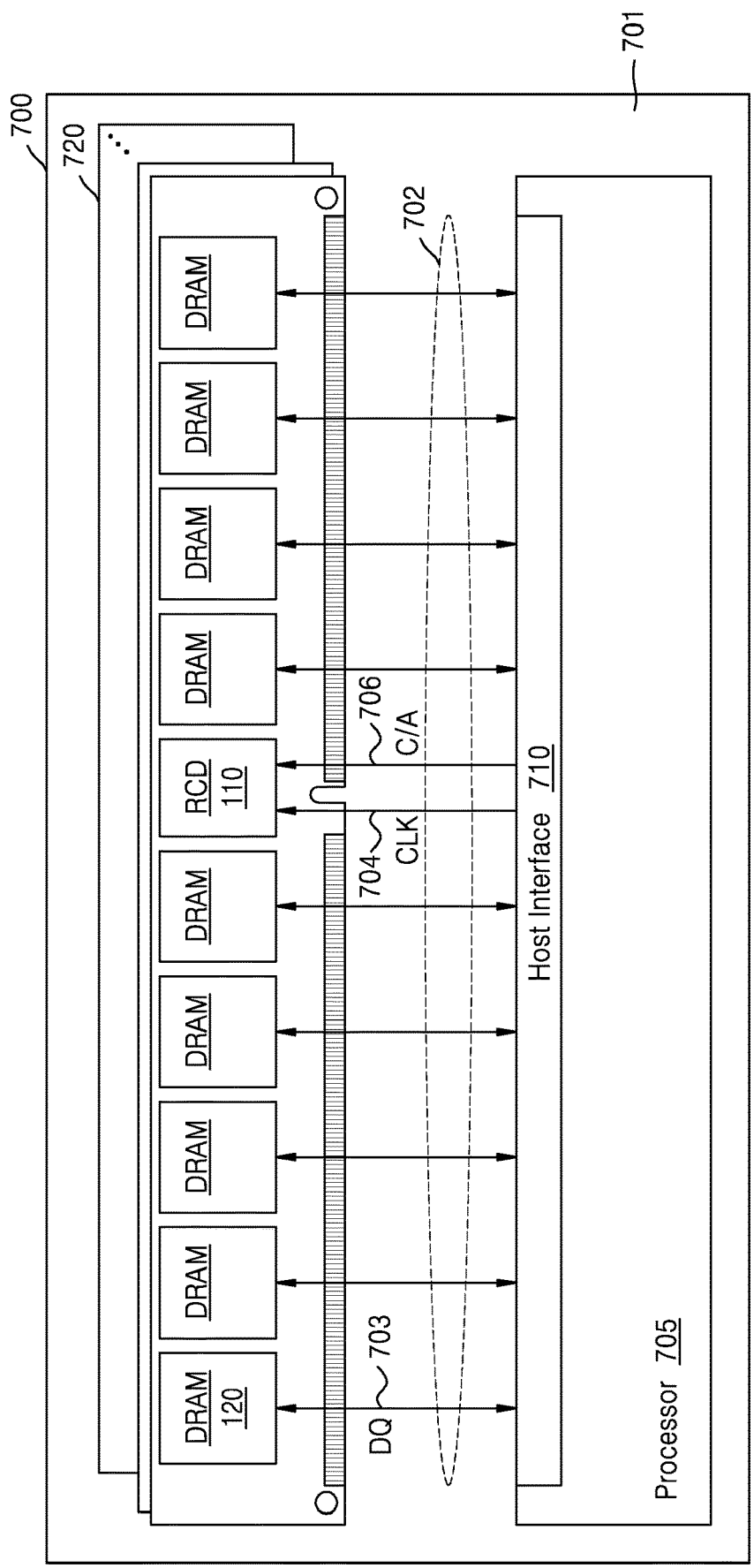
FIG. 7 is a block diagram illustrating a processor-memory system for registered dual in-line memory modules (DIMM) (RDIMM) mounted with a memory device, according to embodiments of the inventive concept.

FIG. 7 is a block diagram illustrating a processor-memory system 700 for the RDIMMs 720 mounted with the memory device 120, according to embodiments of the inventive concept.

Referring to FIG. 7, the processor-memory system 700 may include a board 701 on which one or more RDIMMs 720 and a processor 705 are coupled via one or more memory channels 702. Bidirectional data buses 703 via which the data DQ is transmitted may be coupled to the memory devices 120 and a host interface 710 of the processor 705, respectively. The processor 705 may include a single-core or multi-core processor.

A clock signal CLK line 704 and a C/A signal line 706 may be provided from the host interface 710 to the register clock driver RCD 110. The RCD 110 may provide the clock signal CLK received via the clock signal CLK line 704 to each of the memory devices 120, and provide control/command/address signals received via the C/A signal line 706 to each of the memory devices 120. The RCD 110 may be connected to the memory devices 120 in the fly-by manner, and a module termination resistor may be connected to the C/A signal line 706.

The memory device 120 may be the same as or similar to the memory device 120 described with reference to FIGS. 1 through 6. The memory device 120 may include the BIST unit 128a, the BISR unit 128b, and the training unit 128c that test the memory cell array 122a during the power-up sequence. The BIST unit 128a may perform a test on the memory cell array 122a in response to the power stabilization signal PVCCH, or perform a test on the memory cell array 122a in response to the ZQ calibration command ZQCL. The BIST unit 128a may terminate a test being performed in response to the write leveling command WRLVL, or terminate a test being performed in response to the active command ACT. The BIST unit 128a may store information about fail cell having a defective characteristic in the memory core 122, as a test result of the memory cell array 122a. The BISR unit 128b may replace the defective cell with a redundancy cell by using the redundancy cell included in the memory core 122. The BISR unit 128b may store information about the defective cell that has been repaired with the redundancy cell, together with information about the defective cell. In response to the training command, the training unit 128c may perform the memory core parameter training related with the memory core 122 and/or the periphery circuit parameter training of other periphery circuits not including the memory core 122 in the memory device 120. The training unit 128c may, as a training subject, determine an improved or optimal parameter for a memory core parameter and/or a periphery circuit parameter.

Figure 8:
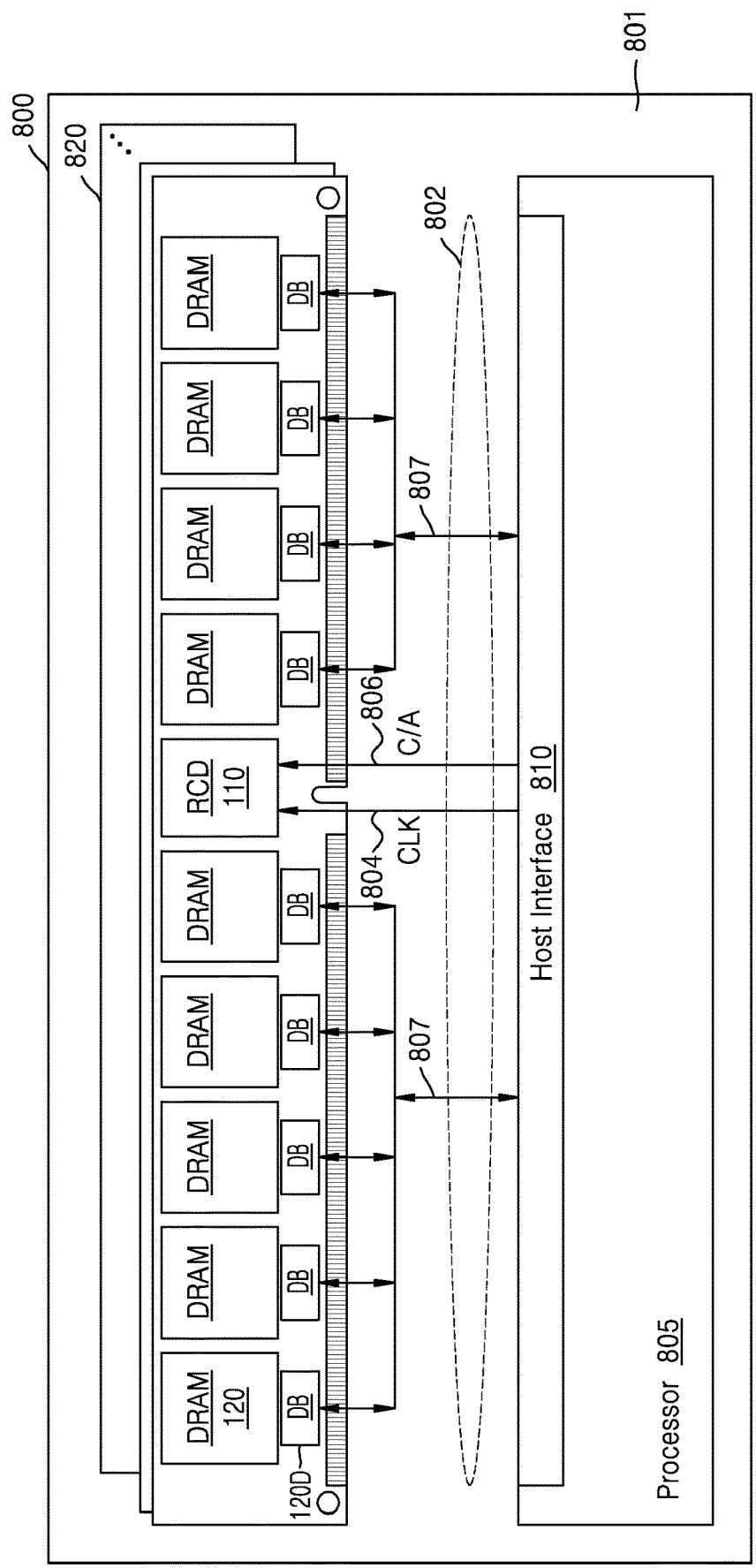
FIG. 8 is a block diagram illustrating a processor-memory system for load reduced DIMM (LRDIMM) mounted with a memory device, according to embodiments of the inventive concept.

FIG. 8 is a block diagram illustrating a processor-memory system 800 for the LRDIMMs 820 mounted with the memory device 120, according to embodiments of the inventive concept.

Referring to FIG. 8, the processor-memory system 800 may include a board 801 on which one or more LRDIMMs 820 and a processor 805 are coupled via one or more memory channels 802. The LRDIMM 820 may be different from the RDIMM 720 in FIG. 7 in that the LRDIMM 820 further includes a data buffer (DB) 120D connected in a one-to-one correspondence with each of the memory devices 120. Descriptions of the LRDIMM 820 given with respect to the RDIMM 720 in FIG. 7 are omitted. The memory devices 120 may include, for example, DRAMs.

Data buses 807, that are bidirectional, via which the data DQ is transmitted, may be coupled to the DB 120D, respectively. On-die termination (ODT) may be provided to each of the DBs 120D connected to the data buses 807. When the data DQ is bi-directionally transmitted to the data buses 807, the data strobe signal DQS may also be transmitted.

The memory device 120 may be the same as or similar to the memory device 120 described with reference to FIGS. 1 through 6. The memory device 120 of FIG. 8 may be the same as or similar to the memory device 120 described with reference to FIGS. 1 through 6. The memory device 120 may include the BIST unit 128a, the BISR unit 128b, and/or the training unit 128c that test the memory cell array 122a during the power-up sequence. The BIST unit 128a may perform a test on the memory cell array 122a in response to the power stabilization signal PVCCH, or perform a test on the memory cell array 122a in response to the ZQ calibration command ZQCL. The BIST unit 128a may terminate a test being performed in response to the write leveling command WRLVL, or terminate a test being performed in response to the active command ACT. The BIST unit 128a may store information about a fail cell having a defective characteristic in the memory core 122, as a test result of the memory cell array 122a. The BISR unit 128b may replace the defective cell with a redundancy cell by using the redundancy cell included in the memory core 122. The BISR unit 128b may store information about the defective cell that has been repaired with the redundancy cell, together with information about the defective cell. In response to the training command, the training unit 128c may perform memory core parameter training related with the memory core 122 and/or the periphery circuit parameter training of other periphery circuits not including the memory core 122 in the memory device 120. The training unit 128c may, as a training subject, determine an optimal parameter for a memory core parameter and/or the periphery circuit parameter.

While the inventive concept has been particularly shown and described with reference to embodiments thereof, it will be understood that various changes in form and details may be made therein without departing from the spirit and scope of the following claims.

What is claimed is:

1. A memory device comprising:
a memory core comprising a memory cell array;
an impedance control (ZQ) engine configured to perform a ZQ calibration operation by using a ZQ resistor connected to a ZQ terminal, in response to a ZQ calibration command; and
a built-in self test (BIST) unit configured to generate a test enable signal in response to the ZQ calibration command, and configured to start a first test comprising testing of the memory cell array based on the test enable signal.

2. The memory device of claim 1, further comprising:
at a power-up of the memory device, a power detector configured to generate a power stabilization signal based on detecting whether a level of a power supply voltage applied to the memory device is stably maintained at a target voltage level,
wherein a second test, comprising performing testing of the memory cell array, is responsive to the power stabilization signal, and
wherein the BIST unit is configured to test the memory cell array by selecting one of the first test or the second test.

3. The memory device of claim 1, further comprising:
a training unit configured to perform a memory core parameter training related to the memory core, in response to a training command.

4. The memory device of claim 3,
wherein the training unit is configured to compensate for skew between a clock signal and a data strobe signal, in response to a write leveling command, and
wherein the BIST unit is configured to perform a first test termination for the first test performed by the BIST unit, in response to the write leveling command.

5. The memory device of claim 4,
wherein the training unit is configured to receive an active command to access the memory cell array during the memory core training,
wherein the BIST unit is configured to perform a second test termination for the first test being performed by the BIST unit, in response to the active command, and
wherein the BIST unit is configured to terminate a test for the memory cell array by selecting one of the first test termination or the second test termination.

6. The memory device of claim 5,
wherein the training unit is configured to perform a periphery circuit parameter training for other periphery circuits not including the memory core in the memory device,
wherein after the periphery circuit parameter training is performed, the training unit is further configured to generate a disable signal indicating that a data pattern preset in a mode register of the memory device is not to be used, and
wherein the BIST unit is configured to selectively perform the first test termination or the second test termination based on the disable signal.

7. The memory device of claim 1, further comprising:
a fail cell table configured to store information related to a fail cell having defective characteristics in the memory cell array as a result of the first test; and
a built-in self repair (BISR) unit configured to replace the fail cell with a redundancy cell that is in the memory cell array, wherein the BISR unit is configured to store information related to repairing the fail cell with the redundancy cell in the fail cell table.

8. A method of operating a memory device, wherein a built-in self test (BIST) unit is configured to test a memory core, and wherein the BIST is embedded in the memory device, the method comprising:
receiving an impedance control (ZQ) calibration command from outside the memory device;
performing a ZQ calibration operation in response to the ZQ calibration command;
generating a test enable signal in response to the ZQ calibration command; and
starting, by the BIST unit, a first test of the memory core based on the test enable signal.

9. The method of claim 8, further comprising:
applying, at power-up of the memory device, a power supply voltage to the memory device;
generating a power stabilization signal by detecting that a level of the power supply voltage is stably maintained at a target voltage level; and
starting, by the BIST unit, a second test of the memory core in response to the power stabilization signal,
wherein the BIST unit is configured to test the memory core by selecting one of the first test and the second test.

10. The method of claim 8, further comprising:
performing a memory core parameter training related with the memory core.

11. The method of claim 10, further comprising:
receiving a write leveling command that triggers compensating for skew between a clock signal from outside the memory device and a data strobe signal during the memory core training; and
performing a first test termination to terminate the first test performed by the BIST unit in response to the write leveling command.

12. The method of claim 11, further comprising:
receiving an active command that enables accessing the memory core during the memory core training; and
performing a second test termination to terminate the first test being performed by the BIST unit in response to the active command,
wherein the BIST unit is configured to terminate a test for the memory core by selecting one of the first test termination or the second test termination.

13. The method of claim 12, further comprising:
performing a periphery circuit parameter training for other periphery circuits not including the memory core of the memory device; and
after performing the periphery circuit parameter training, generating a disable signal indicating that a data pattern preset in a mode register of the memory device is not to be used,
wherein the BIST unit is configured to selectively perform the first test termination or the second test termination based on the disable signal.

14. The method of claim 8, further comprising:
as a result of the first test, storing information related to a fail cell having defective characteristics in a memory cell of the memory core;
repairing the fail cell with redundancy cell that is in the memory core; and
storing information related to the repairing of the fail cell with the redundancy cell in a fail cell table.

15. A memory module comprising:
a printed circuit board; and
a plurality of memory devices coupled to the printed circuit board,
wherein each of the plurality of memory devices further comprises:
a memory core comprising a memory cell array;
an impedance control (ZQ) engine configured to perform a ZQ calibration operation by using a ZQ resistor connected to a ZQ terminal, in response to a ZQ calibration command; and
a built-in self test (BIST) unit configured to generate a test enable signal in response to the ZQ calibration command, and configured to start a first test comprising testing of the memory cell array based on the test enable signal.

16. The memory module of claim 15,
wherein each of the plurality of memory devices further comprises a power detector configured to generate a power stabilization signal based on detecting whether a level of a power supply voltage applied to a respective memory device of the plurality of memory devices is stably maintained at a target voltage level at a power-up of the memory module,
wherein a second test, comprising performing testing of the memory cell array, is responsive to the power stabilization signal, and
wherein the BIST unit is configured to test the memory cell array by selecting one of the first test or the second test.

17. The memory module of claim 15,
wherein each of the plurality of memory devices further comprises a fail cell table configured to store information related to a fail cell having defective characteristics in the memory cell array as a result of the first test,
wherein a built-in self repair (BISR) unit configured to replace the fail cell with a redundancy cell that is in the memory cell array, and
wherein the BISR unit is configured to store information related to repairing the fail cell with the redundancy cell in the fail cell table.

18. The memory module of claim 15, further comprising:
a controller coupled to the printed circuit board,
wherein the controller is configured to control the plurality of memory devices.

19. The memory module of claim 18,
wherein the controller comprises a register clock driver (RCD) configured to provide a clock signal and command/address signals to each of the plurality of memory devices,
wherein each of the plurality of memory devices further comprises a command sequence for queuing command signals provided by the controller according to a power-up sequence of the memory module,
wherein while the command sequencer is configured to sequentially store stored commands comprising the ZQ calibration command, a training command for instructing a memory training, a write leveling command, an active command, and/or a write command, and
wherein the command sequencer is further configured to output the stored commands in a stored order.

20. The memory module of claim 15,
wherein the memory module includes any one of an un-buffered dual in-line memory module (DIMM) (UDIMM), a registered DIMM (RDIMM), a load reduced DIMM (LRDIMM), a fully buffered DIMM (FBDIMM), and a small outline DIMM (SODIMM).

* * * * *